US 6,733,711 B2

(12) United States Patent
Durocher et al.

(10) Patent No.: US 6,733,711 B2
(45) Date of Patent: May 11, 2004

(54) PLASTIC PACKAGING OF LED ARRAYS

(75) Inventors: Kevin Matthew Durocher, Waterford, NY (US); Ernest Wayne Balch, Ballston, NY (US); Vikram B. Krishnamurthy, Clifton Park, NY (US); Richard Joseph Saia, Niskayuna, NY (US); Herbert Stanley Cole, Burnt Hills, NY (US); Ronald Frank Kolc, Cherry Hill, NJ (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/387,835

(22) Filed: Mar. 14, 2003

(65) Prior Publication Data
US 2003/0153108 A1 Aug. 14, 2003

Related U.S. Application Data

(62) Division of application No. 09/654,163, filed on Sep. 1, 2000, now Pat. No. 6,614,103.

(51) Int. Cl.⁷ .......................... B29C 45/14; B29C 70/74
(52) U.S. Cl. .......................... 264/272.14; 264/272.17; 264/272.15; 29/846; 29/854; 29/855
(58) Field of Search .......................... 438/26, 28, 106, 438/113, 119, 121, 124, 125, 129; 264/259, 261, 271.1, 272.11, 272.15, 275, 277; 257/678; 29/831, 846, 854, 855, 856

(56) References Cited

U.S. PATENT DOCUMENTS

| 3,873,889 A | 3/1975 | Leyba |
| 4,567,543 A | 1/1986 | Miniet |
| 4,661,419 A | 4/1987 | Nakamura |
| 4,783,695 A | 11/1988 | Eichelberger et al. |
| 4,933,042 A | 6/1990 | Eichelberger et al. |
| 4,938,280 A | 7/1990 | Clark |
| 5,108,825 A | 4/1992 | Wojnarowski et al. |
| 5,198,679 A | 3/1993 | Katoh et al. |
| 5,226,053 A | 7/1993 | Cho et al. |
| 5,239,448 A | 8/1993 | Perkins et al. |
| 5,353,498 A | 10/1994 | Fillion et al. |
| 5,527,741 A | 6/1996 | Cole et al. |
| 5,571,451 A | 11/1996 | Srivastava et al. |
| 5,672,548 A | 9/1997 | Culnane et al. |
| 5,813,753 A | 9/1998 | Vriens et al. |
| 5,847,507 A | 12/1998 | Butterworth et al. |
| 5,851,063 A | 12/1998 | Doughty et al. |
| 5,895,932 A | 4/1999 | Bojarczuk, Jr. et al. |

(List continued on next page.)

FOREIGN PATENT DOCUMENTS

JP 2000-200929 12/1998

OTHER PUBLICATIONS

Butler, Keith, *Fluorescent Lamp Phosphors*, pp. 98–107 (The Pennsylvania State University Press 1980).
Nakamura et al., *The Blue Laser Diode*, pp. 216–221, 328–329 (Springer 1997).
Blasse et al., *Luminescent Materials*, pp. 109–110 (Springer–Verlag 1994).

Primary Examiner—Angela Ortiz
(74) Attorney, Agent, or Firm—Foley & Lardner

(57) ABSTRACT

There is provided a flexible circuit module, including at least one rigid carrier, at least one solid state device mounted over a first side of the at least one rigid carrier, a flexible base supporting a second side of the at least one rigid carrier, a conductive interconnect pattern on the flexible base, and a plurality of feed through electrodes extending from the first side to the second side of the at least one rigid carrier and electrically connecting the conductive interconnect pattern with the at least one of a plurality of the solid state devices. The solid state devices may be LED chips to form an LED array module.

20 Claims, 6 Drawing Sheets

U.S. PATENT DOCUMENTS

| | | |
|---|---|---|
| 5,898,185 A | 4/1999 | Bojarczuk, Jr. et al. |
| 5,925,897 A | 7/1999 | Oberman |
| 5,931,577 A | 8/1999 | Ishibashi |
| 5,966,393 A | 10/1999 | Hide et al. |
| 5,998,925 A | 12/1999 | Shimizu et al. |
| 6,066,861 A | 5/2000 | Höhn et al. |
| 6,069,440 A | 5/2000 | Shimizu et al. |
| 6,132,072 A | 10/2000 | Turnbull et al. |
| 6,331,063 B1 | 12/2001 | Kamada et al. |
| 2001/0030866 A1 | 10/2001 | Hochstein |
| 2003/0160256 A1 | 8/2003 | Durocher et al. |

US 6,733,711 B2

PLASTIC PACKAGING OF LED ARRAYS

The present application is a divisional of the U.S. application Ser. No. 09/654,163, filed Sep. 1, 2000, now U.S. Pat. No. 6,614,103.

BACKGROUND OF THE INVENTION

This invention relates generally to semiconductor device packaging and specifically to plastic packaging of light emitting diode ("LED") arrays.

Semiconductor light emitting diodes are semiconductor chips that are mounted in a package and emit radiation in response to an applied voltage or current. These LEDs are used in a number of commercial applications such as automotive, display, safety/emergency and directed area lighting.

One type of conventional LEDs is packaged in individual, transparent shells. Each shell contains one LED chip encapsulated by an encapsulating material, such as an epoxy. However, when an array of LEDs is required for lighting applications, the individual shells are interconnected by connecting the individual LED lead frames with rigid metal lines. Such an LED array is fragile and difficult to bend into the desired shape due to the rigidity of the connecting metal lines. Thus, such an LED array cannot be easily fit into a curved lighting product, such as a round bulb.

Another type of conventional LED arrays is fabricated on a plastic substrate, as illustrated in FIG. 1. The LED chips or die 1 are physically and electrically mounted on cathode leads 3. The top surfaces of the LED chips 1 are electrically connected to anode leads 5 with lead wires 7. The lead wires are attached by known wire bonding techniques to a conductive chip pad. The leads 3, 5 comprise a lead frame and may be made of a metal, such as silver plated copper. The lead frame and LED chip array are contained in a plastic package 9, such as a LEXAN® package. The plastic package 9 is filled with an encapsulating material 13, such as a glass-filled epoxy. The package 9 contains tapered interior sidewalls 15 which enclose the LED chips 1, and form a light spreading cavity 17 which ensures cross fluxing of LED light.

However, the plastic package 9 and the lead frame 3, 5 are rigid. Thus, these LED arrays are also rigid and difficult to bend into a desired shape. These LED arrays also cannot be easily fit into a curved lighting product, such as a round bulb. The present invention is directed to overcoming or at least reducing the problems set forth above.

BRIEF SUMMARY OF THE INVENTION

In accordance with one aspect of the present invention, there is provided a flexible circuit module, comprising at least one rigid carrier, at least one solid state device mounted over a first side of the at least one rigid carrier, a flexible base supporting a second side of the at least one rigid carrier, a conductive interconnect pattern on the flexible base, and a plurality of feed through electrodes extending from the first side to the second side of the at least one rigid carrier and electrically connecting the conductive interconnect pattern with the at least one of a plurality of the solid state devices.

In accordance with another aspect of the present invention, there is provided a method of forming a flexible circuit module, comprising adhering a first side of at least one rigid carrier over a first side of a flexible module base, forming a conductive interconnect pattern having a first portion over a second side of the flexible module base and a plurality of second portions extending through the flexible module base toward the at least one rigid carrier, and forming at least one solid state device on a second side of the at least one rigid carrier and in electrical contact with the conductive interconnect pattern through the at least one rigid carrier.

In accordance with another aspect of the present invention, there is provided a method of forming a packaged solid state device, comprising placing at least one conductive element into a mold cavity, filling the mold cavity with a fluid insulating material, solidifying the fluid insulating material to form an insulating carrier, wherein at least two surfaces of the at least one conductive element are exposed after solidification, and placing at least one solid state device on the insulating carrier in contact with one surface of the at least one conductive element.

DETAILED DESCRIPTION OF THE INVENTION

In view of the problems in the prior art, it is desirable to obtain an LED array that is packaged such that it may be bent into a desired shape. It is also desirable to obtain a conformal LED array that can easily fit into a variety of differently shaped lighting products, such as spherical, cylindrical or curved products, including a round lamp bulb, a flood light, a cylindrical flashlight or a shaped display.

The present inventors have discovered that a conformal LED array module may be provided by placing individual LED chips into rigid carriers and mounting the rigid carriers onto a flexible base. The flexible base may be bent into a desired shape so that the LED array can easily fit into a variety of lighting products. The rigid carrier contains feed through electrodes and an optional heat sink which connect to the back side of the LED chips to provide a low thermal resistance for the LED array resulting in longer LED lifetimes. An interconnect pattern is located on the back side of the flexible base and contains portions that are electrically connected with the feed through electrodes to provide back side electrical connectivity to the LED chips without blocking any light emission from the LED chips.

I. The Carrier

1. The First Preferred Embodiment

Figure 1:
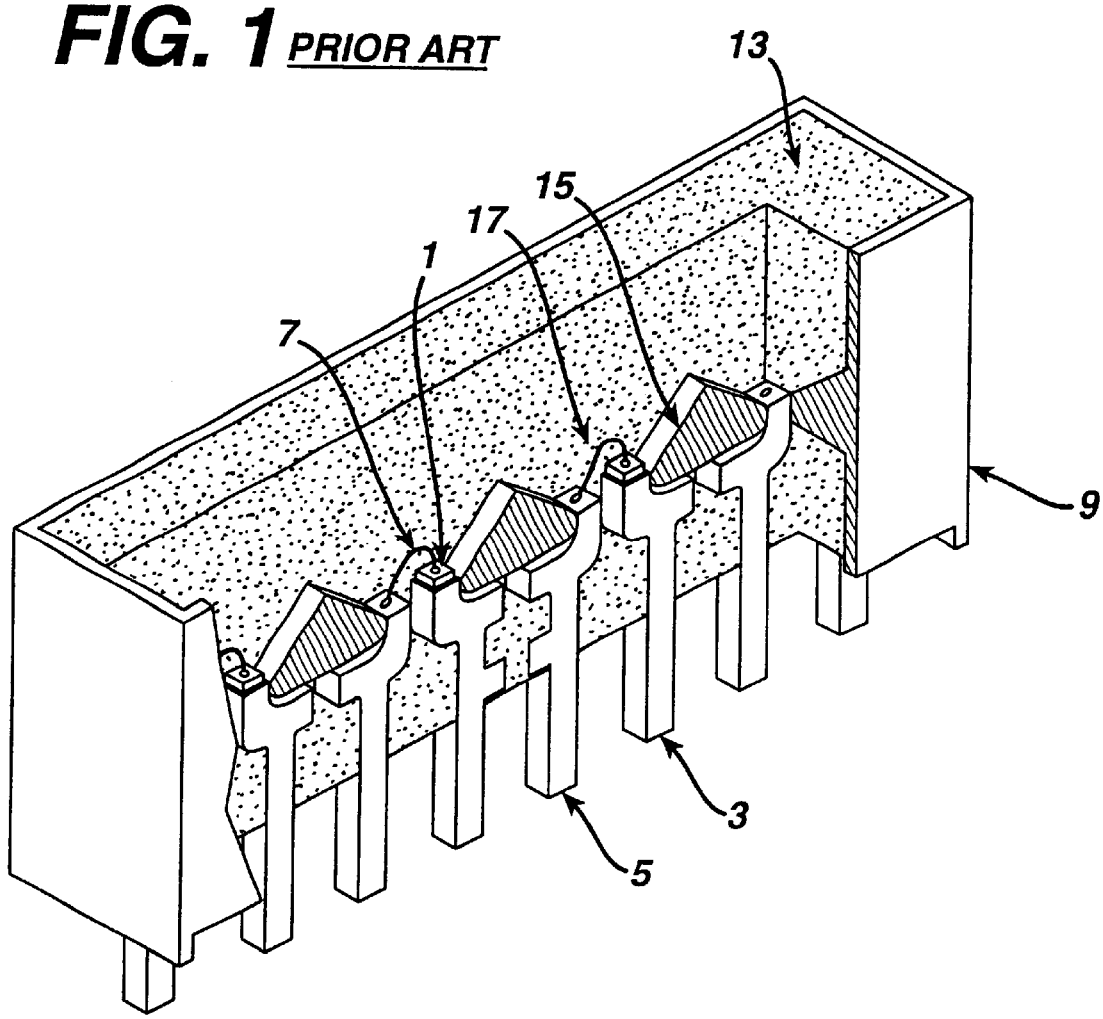
FIG. 1 is a three dimensional view of a prior art LED array.
Figure 2:
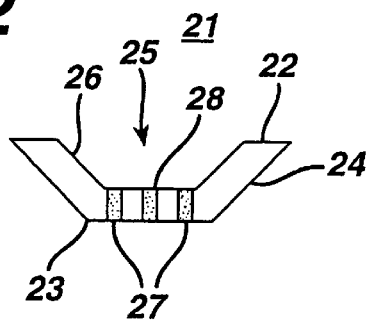
FIG. 2 is a side cross sectional view of a carrier according to a first preferred embodiment of the present invention.

A method of making a conformal LED array module according to several preferred embodiments of the present invention will now be described. FIG. 2 illustrates a rigid carrier 21 according to the first preferred embodiment of the present invention. The carrier may be made of any electrically insulating material, such as plastic, which is able to resist LED chip operating temperatures without excessive deformation. However, other insulating materials, such as ceramics may be used instead. Preferably, the carrier 21 is formed by molding any moldable plastic or polymer material, such as a thermal set epoxy filled with silica or beryllia. For example, Plaskon® SMT-B-1 material supplied by Amoco Electronic Materials, Inc. may be molded into the rigid carrier 21, as will be described in more detail below.

The carrier 21 may have any desired shape that allows the carrier to house an LED chip. For example, the carrier 21 has a first side 22 and a second side 23. Furthermore, the carrier 21 may have a cup shape with straight or inclined outer walls 24 and a cavity 25 having side walls 26. The cavity 25 will used to house one LED chip. However, if desired, the cavity 25 may be wide enough to house a plurality of LED chips. Preferably, the cavity side walls 26 are inclined at an angle of about 35 to about 70 degrees, most preferably about 40 to about 60 degrees, with respect to the bottom of the cavity, to form a light spreading cavity which ensures cross fluxing of LED light. The carrier may be about 10 to about 50 mils, preferably about 25 to about 35 mils thick between sides 22 and 23 in cavity portion 25.

The carrier 21 preferably contains embedded conductive feed through elements. The feed through elements preferably have a post shape and are embedded in the carrier 21. For example, the two feed through electrodes 27 extend from the first side 22 of the carrier 21 to the second side 23 of the carrier, such that one end of the electrodes is exposed in the cavity 25 in the first side 22 of the carrier and the other end of the electrodes is exposed on the second side 23 of the carrier. The electrodes 27 will be used to electrically connect the LED chip with a conductive interconnect.

The carrier may also optionally contain a feed through heat sink 28. The heat sink extends from the first side 22 of the carrier 21 to the second side 23 of the carrier, such that one end of the heat sink 28 is exposed in the cavity 25 in the first side 22 of the carrier and the other end of the heat sink is exposed on the second side 23 of the carrier. The heat sink 28 will be used to contact the LED chip to remove heat from the LED chip during operation. If desired, more than one heat sink 28 may be included, or the heat sink 28 may be omitted and the electrodes 27 may instead be used to remove heat from the LED chip.

2. The Second Preferred Embodiment

Figure 3:
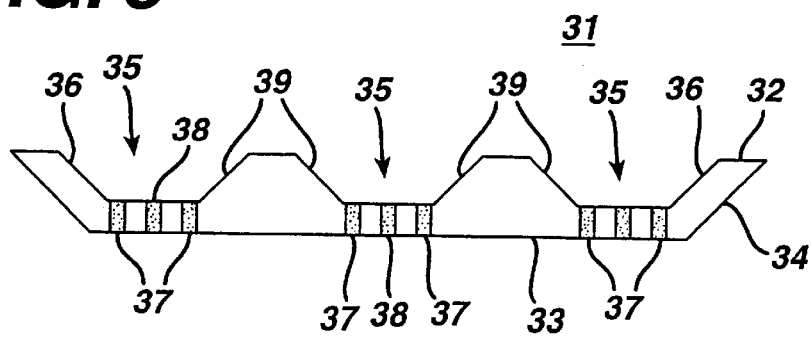
FIG. 3 is a side cross sectional view of a carrier according to a second preferred embodiment of the present invention.

FIG. 3 illustrates a rigid carrier 31 according to the second preferred embodiment of the present invention. The rigid carrier 31 of the second preferred embodiment differs from the carrier 21 of the first preferred embodiment in that it contains a plurality of cavities 35 that will contain LED chips. For example, as illustrated in FIG. 3, the carrier 31 contains three cavities 35 on its first side 32. However, two or more than three cavities 35 may be used.

The cavities 35 contain outer side walls 36, as in the first embodiment, but in addition also contain inner side walls 39 which separate the individual cavities. The side walls 36 and 39 are preferably inclined at an angle of about 35 to about 70 degrees, most preferably about 40 to 60 degrees, with respect to the bottom of the cavities 35 to form a light spreading cavity which ensures cross fluxing of LED light. The carrier 31 may be about 10 to about 50 mils, preferably 25 to 35 mils thick between sides 32 and 33 in cavity portion 35; and about 40 to about 80 mils, preferably about 55 to about 65 mils thick, between sides 32 and 33 in the portion separated by inner cavity side walls 39.

As in the first embodiment, the rigid carrier 31 of the second embodiment contains straight or inclined outer walls 34. The carrier 31 also contains plurality of feed through conductive elements, such as electrodes 37 and optional heat sinks 38 that are exposed on the first 32 and second 33 sides of the carrier 31.

II. The Method of Making the LED Array Module

Figure 9:
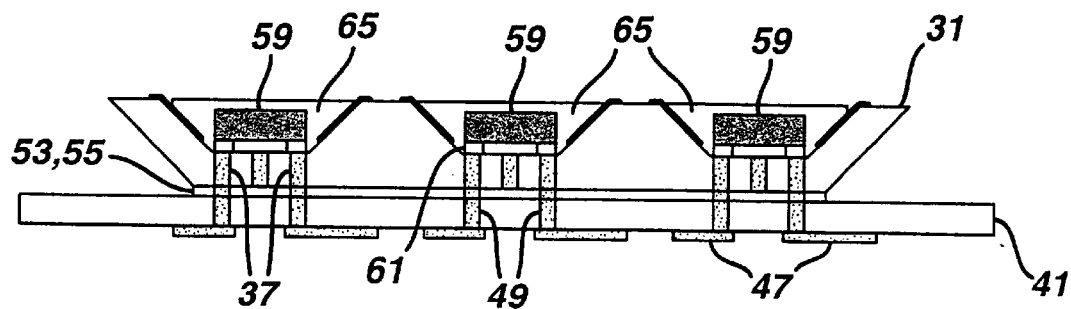
FIG. 9 is a side cross sectional view of a module according to the second preferred embodiment of the present invention containing a plurality of encapsulated LED chips mounted according to one preferred aspect of the present invention.
Figure 10:
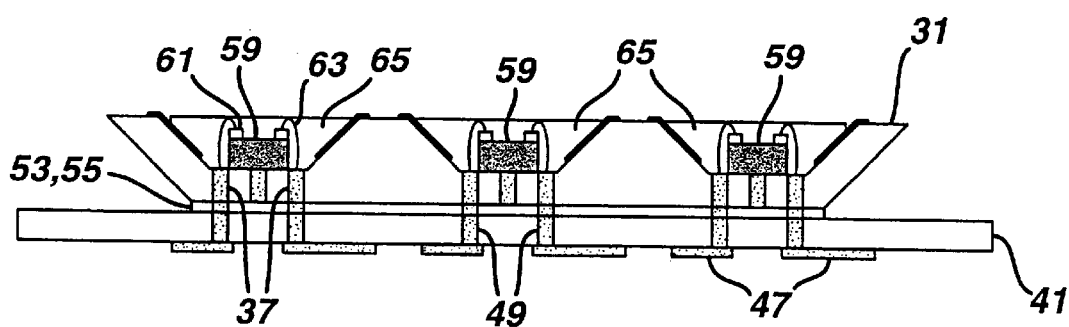
FIG. 10 is a side cross sectional view of a module according to the second preferred embodiment of the present invention containing a plurality of encapsulated LED chips mounted according to another preferred aspect of the present invention.
Figure 11:
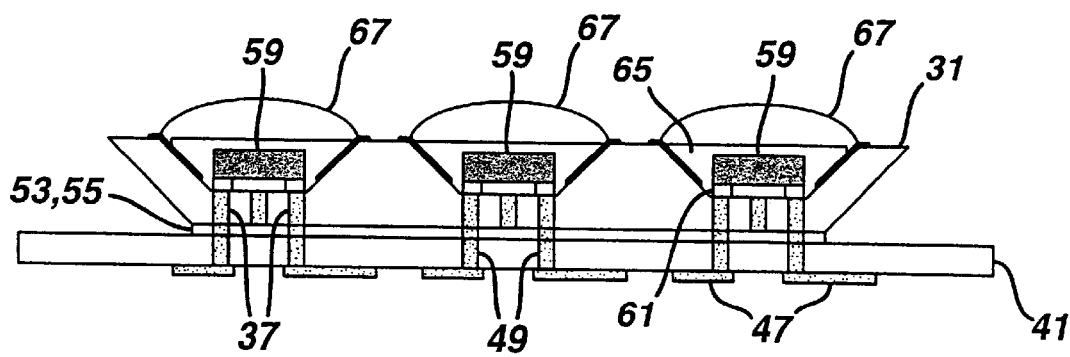
FIG. 11 is a side cross sectional view of a module according to the second preferred embodiment of the present invention containing a plurality of lens structures over the LED chips mounted according to one preferred aspect of the present invention.
Figure 12:
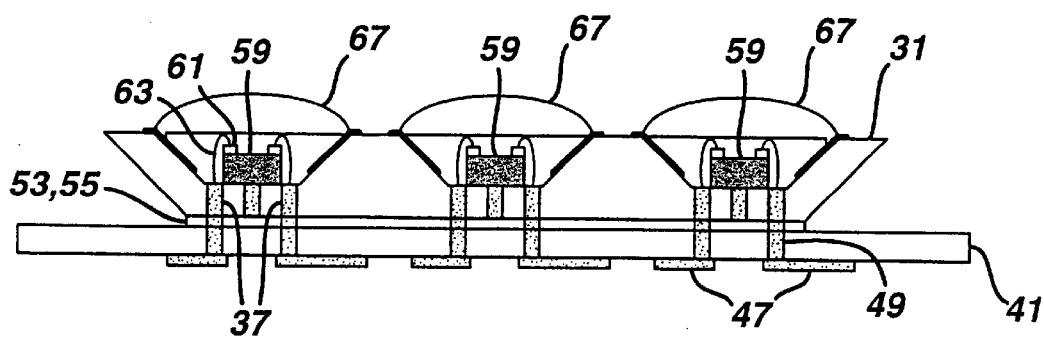
FIG. 12 is a side cross sectional view of a module according to the second preferred embodiment of the present invention containing a plurality of lens structures over the LED chips mounted according to another preferred aspect of the present invention.
Figure 13:
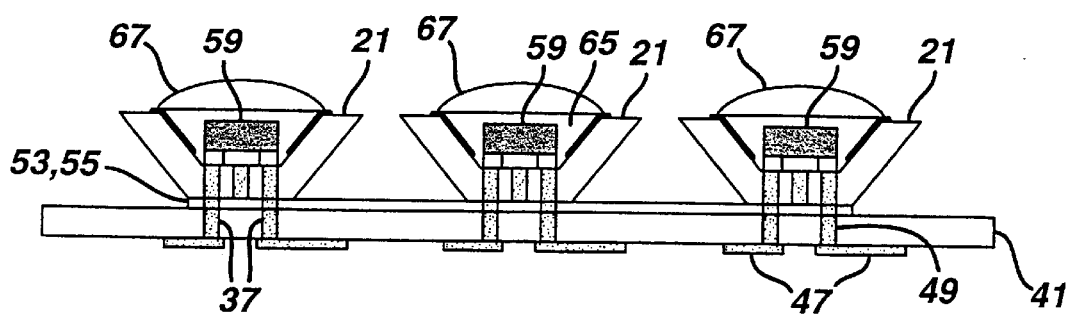
FIG. 13 is a side cross sectional view of a plurality of modules according to the first preferred embodiment of the present invention containing a plurality of lens structures over the LED chips mounted according to one preferred aspect of the present invention.

FIGS. 4–10 illustrate subsequent steps in the method making the LED array module. For ease of description, the rigid carrier 31 of the second embodiment is illustrated in these Figures. However, it should be understood that the method shown in FIGS. 4–10 is equally applicable to the rigid carrier 21 of the first preferred embodiment. FIGS. 11 and 12 illustrate a completed LED array module according to different preferred aspects of the second preferred embodiment made by the method illustrated in FIGS. 4–10. FIG. 13 illustrates a completed LED array module according to the first preferred embodiment made by the method illustrated in FIGS. 4–10.

1. Adhering the Carrier to a Base

A. The First Preferred Aspect: the Anisotropic Adhesive

Figure 4:
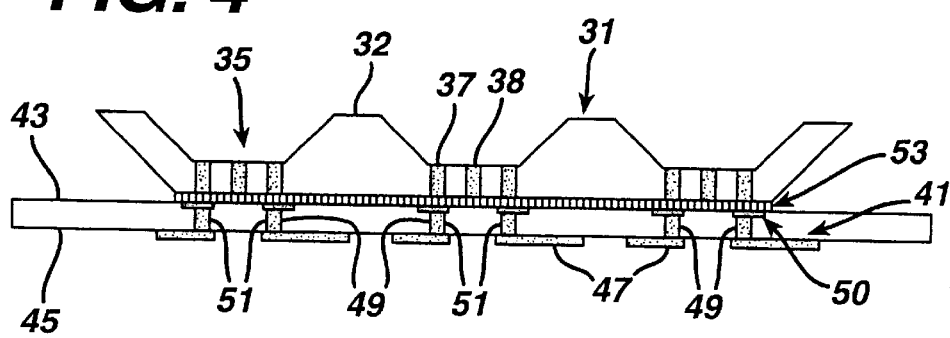
FIG. 4 is a side cross sectional view of a carrier according to the second preferred embodiment of the present invention adhered to a flexible base to form a module according to one preferred aspect of the present invention.
Figure 5:
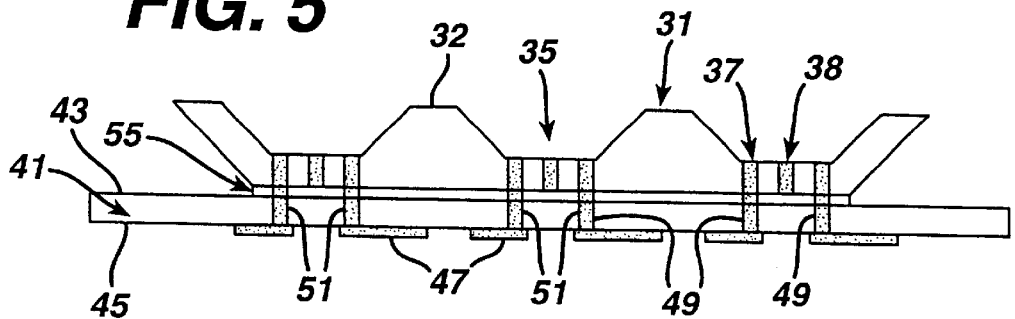
FIG. 5 is a side cross sectional view of a carrier according to the second preferred embodiment of the present invention adhered to a flexible base to form a module according to another preferred aspect of the present invention.

FIGS. 4 and 5 illustrate two preferred alternative aspects of the second step in the method making the LED array module after the first step of providing the carrier. In the first preferred aspect, an anisotropic conductive adhesive connects the carrier(s) 31 (and 21) to a flexible module base 41, as illustrated in FIG. 4. For example, a first side 43 of the flexible base 41 is attached or adhered to the second side 33 of the carrier 31. A first portion 47 of a conductive interconnect pattern is formed on the second side 45 of the flexible base. A plurality of second portions 49 of the conductive interconnect pattern extend through vias 51 in the base 41 to the first side 43 of the base. Preferably, the second portions 49 connect to a conductive interconnect pattern 50 formed on the first side 43 of the flexible base 41. An anisotropic conductive adhesive layer 53 adheres the base 41 to the carrier 31. The second portions 49 of the conductive interconnect pattern contact the adhesive layer 53, which in turn contacts the feed through electrodes 37 exposed in the second side 33 of the carrier 31. Thus, the interconnect pattern 47, 49, 50 is electrically connected to the electrodes 37.

The flexible base 41 is preferably a sheet that is substantially thinner than the carrier 31. For example, the base 41 is preferably a sheet having a thickness of 0.5 to 3 mils, most preferably 1 to 2 mils thick, and is at least 10 times thinner than the carrier 31. Preferably, the base comprises a flexible plastic sheet that can support a plurality of carriers 31 and that can be bent into a desired shape. For example, the base 41 may comprise a Kapton® polyimide sheet that is provided as a roll by E.I. DuPont De Nemours & Co. However, any other plastic sheet, such as Ultem® polyetherimide resin provided by the General Electric Company, Apical® polyimide sheet provided by Kanegafuchi Chem. Indus. Co. or Upilex® polyimide sheet provided by UBE Indus. Inc., may also be used. Alternatively, the base 41 may comprise a flexible epoxy/glass circuit board.

The base 41 illustrated in FIG. 4 is preferably prefabricated with the interconnect pattern 47, 49, 50 prior to adhering it to the carriers 31. The interconnect pattern may be formed on the base by first forming vias 51 in the base 41 by laser drilling, mechanical drilling, hole punching or etching. A metal layer, such as copper, nickel, gold or alloys thereof is then formed over the base by plating, sputtering or any other coating method. The metal layers are then patterned into the interconnect patterns by photolithography or similar methods. Alternatively, the interconnect patterns may be formed by selectively depositing the metal layer onto the desired areas, such as by electroless plating or other selective deposition methods. For example, a seed layer from a $SnCl_2$ or SnPt solution may be selectively applied to the desired areas followed by dipping the base 41 into a copper or nickel plating solution to form the copper or nickel interconnect pattern.

The prefabricated base 41 containing the interconnect pattern is then adhered to a plurality of carriers 31 by using an adhesive layer 53 between the first surface 43 of the base 41 and the second surface 33 of the carriers 31. Preferably, the adhesive layer 53 is first applied to the second side 33 of each carrier 31, and the carriers 31 are then placed onto the first surface 43 of the base by a high speed pick-and-place apparatus or by using a temporary carrier, such as wax or a wafer membrane (for example, Nitto Tape® provided by Nitto Co. or Blue Membrane® provided by Semiconductor Equipment Corp.). Alternatively, the base 41 may be adhered to the stationary carriers 31. Furthermore, the adhesive layer 53 may be first applied to the base 41 rather than to the carriers 31.

In the first preferred aspect illustrated in FIG. 4, the adhesive layer 53 preferably comprises an anisotropic conductive adhesive, which is electrically conductive substantially along a first axis (i.e., a vertical or z-axis) between the rigid carrier and the flexible base, but is electrically insulating substantially along a direction perpendicular to the first axis. For example, a Z-axis adhesive layer 5303R® from 3M Inc. may be used as the adhesive layer 53. The anisotropic adhesive contains conductive particles in an insulating matrix. Each particle extends from one side of the adhesive layer to the other, thus allowing electric conduction along the z-axis. However, the particles do not contact each other. Thus, the adhesive 53 layer does not allow electric conduction in the x-y plane.

B. The Second Preferred Aspect: the HDI Method

FIG. 5 illustrates a second alternative aspect of the second step in the method making the LED array module. In the second aspect illustrated in FIG. 5, the flexible base 41 is adhered to the rigid carrier 31 prior to forming the interconnect pattern using the high density interconnect (HDI) method. In contrast, in the first aspect of FIG. 4, the interconnect is formed on the base 41 prior to adhering the base to the carrier.

For example, the base 41 may be adhered to one or more carriers 31 using any suitable adhesive layer 55. The adhesive does not have to be anisotropic or conductive, as in the first aspect of FIG. 4, but may be insulating. Any suitable thermoplastic, thermoset or other adhesive may be used. For example, the adhesive layer 55 may comprise a contact adhesive, such as Ultem® polyetherimide resin (available from the General Electric Company), which is heated at about 260° C. under vacuum for about three minutes and cooled under a pressure of 30 psi, as disclosed in U.S. Pat. No. 4,933,042, incorporated herein by reference. Alternatively, the adhesive may comprise an epoxy or a cyanoacrylate adhesive, as disclosed in U.S. Pat. No. 4,933,042, or an epoxy/polyimide copolymer blend, as disclosed in U.S. Pat. No. 5,108,825, both incorporated herein by reference. However, the adhesive layer 55 may be omitted if the base 41 is made of a sufficiently adhesive material, such as Ultem® polyetherimide.

A number of via openings 51 are then formed through the base 41 and the adhesive layer 55 to expose the bottom portions of the feed through electrodes 37, as shown in FIG. 5. If desired, other vias 51 may be made to expose the heat sinks 38. Vias 51 may be formed by suitable methods, such as laser drilling, or plasma etching. The bottom surfaces of the electrodes 37 may be used as a drilling stops or etch stops because the electrode 37 metal is more resistant to drilling or etching than the plastic or polymer base 41 and the adhesive layer 55.

The conductive interconnect pattern 47, 49 is then formed on the second side 45 of the base and in the via holes 51 by any suitable method, such as the high density interconnect (HDI) method disclosed in U.S. Pat. Nos. 5,527,741 and 4,783,695, incorporated herein by reference in their entirety. For example, a metal layer, such as copper, nickel, gold or alloys thereof is formed over the base by plating, sputtering or any other coating method. The metal layer is then patterned into the interconnect pattern by photolithography or similar methods. Alternatively, the interconnect pattern may be formed by selectively depositing the metal layer onto the desired areas, such as by electroless plating or other selective deposition methods. For example, a seed layer from a $SnCl_2$ or SnPt solution may be selectively applied to the desired areas followed by dipping the base 41 into a copper or nickel plating solution to form the copper or nickel interconnect pattern. Preferably, the interconnect pattern 47 is about 2 to about 10 microns thick.

If desired, the feed through electrodes 37 may be formed in the same step as the interconnect pattern 47, 49, instead of being formed in the carrier 31 prior to adhering the carrier 31 to the base 41. However, such process is not preferred because it requires forming deep via holes through the thick carrier 31 followed by filling of the deep via holes with the metal for forming the electrodes. In contrast, forming and filling shallow via holes 51 which extend only through the base 41 and the adhesive layer 55 is preferred.

2. Depositing a Reflective Metal Coating

Figure 6:
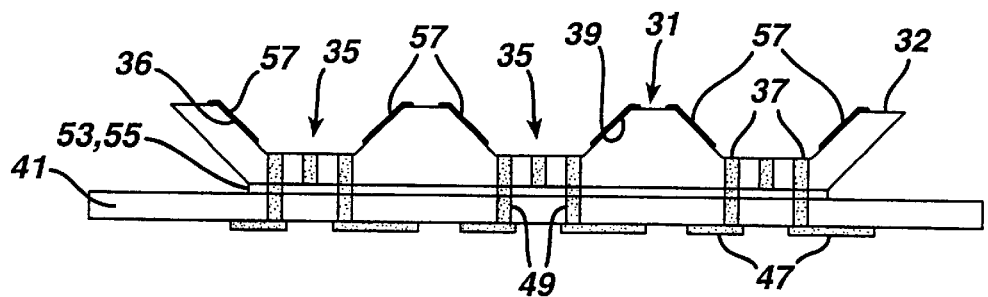
FIG. 6 is a side cross sectional view of a module according to the second preferred embodiment of the present invention containing a reflective layer.

FIG. 6 illustrates the third step in forming the LED array module after the adhering step illustrated in FIG. 4 or in FIG. 5. A reflective metal coating 57 is deposited and patterned on the first surface 32 of the carrier 31. Preferably, the reflective metal coating is formed at least on the side walls 36, 39 of the cavities 35. For example, the reflective metal coating 57 may comprise sputtered and photolithographically patterned aluminum. The reflective metal coating 57 will be used to reflect the light emitted by the LED chips placed in the cavities 35. However, the coating 57 may be omitted to simplify processing or added to carrier 21 or 31 prior to attachment to base 41, if desired.

3. Mounting the LED Chips

Figure 7:
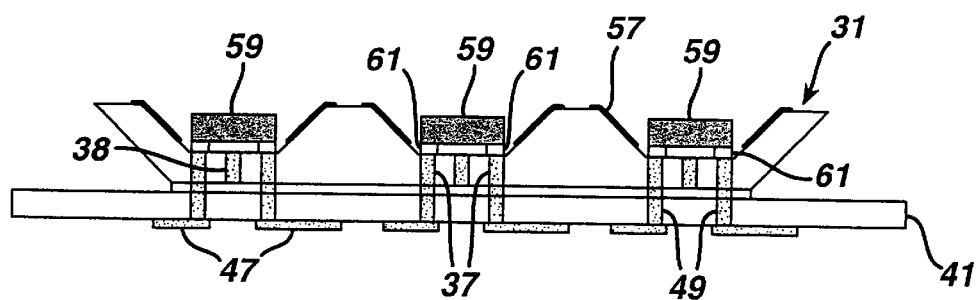
FIG. 7 is a side cross sectional view of a module according to the second preferred embodiment of the present invention containing a plurality of LED chips mounted according to one preferred aspect of the present invention.
Figure 8:
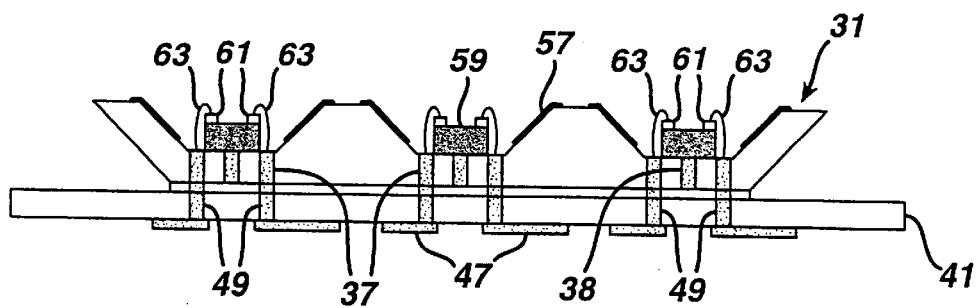
FIG. 8 is a side cross sectional view of a module according to the second preferred embodiment of the present invention containing a plurality of LED chips mounted according to another preferred aspect of the present invention.

FIGS. 7 and 8 illustrate first and second preferred aspects of the fourth step of mounting the LED chips 59 in the cavities 35 of the carrier 31 of the second preferred embodiment of the present invention. FIG. 7 illustrates the flip chip LED connection method according to the first preferred aspect, while FIG. 8 illustrates the lead wire bonding LED connection method according to the second preferred aspect.

The LED chips or die 59 may comprise any chips which emit visible, ultraviolet or infrared radiation. Thus, the LED chips 59 may comprise any LED chip 59 containing a p-n junction of any semiconductor layers capable of emitting the desired radiation. For example, the LED chips 59 may contain any desired III–V compound semiconductor layers, such as GaAs, GaAlAs, GaN, InGaN, GaP, etc., or II–VI compound semiconductor layers such ZnSe, ZnSSe, CdTe, etc., or IV—IV semiconductor layers, such as SiC. The LED chips 59 may also contain other layers, such as cladding layers, waveguide layers and contact layers.

A. The First Preferred Aspect: the Flip Chip Connection

As shown in FIG. 7, the LED chips 59 or die of the first preferred aspect contain bonding pads 61. The LED chips 59 are placed into cavities 35 with the bonding pads 61 down to contact the exposed surfaces of the feed through electrodes 37 (i.e., the flip chip configuration). The LED chips 59 may be attached to the carrier 31 and the electrodes 37 using any suitable flip chip bonding method.

For example, 75–150 microns high solder bumps formed on bonding pads 61 can be used to connect the chips 59 or die to the electrodes 37. The space between the chips 59 and surface of the carrier 31 may also be optionally filled with an epoxy resin filled with inorganic powder, such as silica. This may serve to reduce solder joint cracking caused by the mismatch in the coefficient of thermal expansion (CTE) between the chips 59 and the carrier 31. The flip chip connection process can also be done using polymer adhesives. Examples include an electroless nickel bump on the chip pads 61 with an isotropically conductive adhesive, or a gold bump on the chip pads 61 with anisotropically conductive adhesive to make the electrical contact to electrodes 37.

Furthermore, if the heat sinks 38 are present, then the LED chips 59 may be arranged to contact the heat sinks 38. For example, an insulating thermosetting epoxy filled with alumina or beryllia may be placed between the heat sinks 38 and the LED chips 59 to provide a thermal conduit.

B. The Second Preferred Aspect: Lead Wire Bonding

As shown in FIG. 8, the LED chips 59 or die of the second preferred aspect also contain bonding pads 61. The LED chips 59 are placed into cavities 35 with the bonding pads 61 up, and thin metal lead wires 63 are used to electrically connect the pads 61 to the electrodes 37. Any lead wire formation method, such as soldering, may be used. Thus, the LED chips 59 are electrically connected with the interconnect pattern 47, 49 through the electrodes 37 and the lead wires 63.

Furthermore, if the heat sinks 38 are present, then the LED chips 59 may be arranged to contact the heat sinks 38. For example, the bottom surface of the LED chips 59 may directly contact the heat sinks 38 or a thermosetting epoxy filled with alumina or beryllia may be placed between the heat sinks 38 and the LED chips 59 to provide a thermal conduit.

C. The Third Preferred Aspect: Flip Chip and Lead Wire

While the first and second aspects illustrated in FIGS. 7 and 8 illustrate separate flip chip and wire bonding connection methods, both methods may be used simultaneously. For example, one pad 61 of a chip 59 may be located on the top surface of the chip 59. This pad 61 may be connected to the respective electrode 37 by a lead wire 63. A second pad 61 of the same chip 59 may be located on the bottom surface of the chip 59. This pad 61 may be directly connected to the respective electrode 37 through a bonding agent, such as a eutectic or epoxy. Furthermore, while only a single LED chip 59 is placed into each cavity 35 in the Figures, the cavity 35 may be made wide enough to place a plurality of LED chips 59 into a single cavity 35, if desired.

4. Encapsulation

FIGS. 9 and 11 illustrate the fifth and sixth steps, respectively, according to the first (flip chip) preferred aspect of the second preferred embodiment of the present invention. FIGS. 10 and 12 illustrate the fifth and sixth steps, respectively according to the second (wire bonding) preferred aspect of the second preferred embodiment of the present invention.

As shown in FIG. 9, after the flip chip LED chips 59 are connected to the electrodes 37, an encapsulating material 65 is filled into the cavities 35. Likewise, as shown in FIG. 10, after the wire bonded LED chips 59 are connected to the electrodes 37, the encapsulating material 65 is filled into the cavities 35. The encapsulating material 65 may be an epoxy, a glass filled epoxy or a polymer material, such as silicone.

If desired, the encapsulating material 65 may also contain a phosphor material interspersed therein. For example, the phosphor material converts one wavelength of LED radiation into another wavelength(s). For example, for blue emitting InGaN active layer LED chips 59, the phosphor material may comprise YAG:Ce$^{3+}$, which converts the blue LED light into yellow light. The human observer perceives the combination of the blue LED light and the yellow phosphor light as white light. Thus, a white light emitting LED array may be formed. If desired, other phosphors and LEDs may be used to achieve an output that appears white or another desired color to the human observer.

III. The Final LED Array Module Structure

FIGS. 11 and 12 illustrate a final structure of the LED arrays modules according to the first (flip chip) and second (lead wire) preferred aspects, respectively, of the second preferred embodiment of the present invention. The LED array modules contain an optional lens structure 67 formed over each encapsulated LED chip 59. The lens structure 67 may comprise any suitable material that is transparent to LED radiation. For example, the lens structure 67 may comprise a polycarbonate layer. The lens structure 67 improves the light output of the LED chips 59. However, the lens structure 67 may be omitted to simplify processing if desired. Furthermore, if desired, the phosphor material may be formed on the light emitting surface of the LED chips 59 or on the inner surface of the lens structure 67 instead of being interspersed in the encapsulating material 65.

FIG. 13 illustrates a final structure of the LED array according to the first preferred embodiment of the present invention. In the first preferred embodiment, each carrier 21 contains one LED chip 59, in contrast to the second preferred embodiment illustrated in FIGS. 3–12, where each carrier 31 contains a plurality of LED chips 59. Otherwise, the LED array according to the first preferred embodiment is made by the same process(es) and contains the same structure as the LED arrays of the second preferred embodiment. While the flip chip bonded aspect of the LED array is illustrated in FIG. 13, it should be understood that the LED chips 59 of FIG. 13 may alternatively be bonded to the electrodes 37 with lead wires 63.

After processing, the LED array modules according to the preferred embodiments of the present invention are inserted into a variety of differently shaped lighting products, such as products containing curved, cylindrical or spherical shells, including a round lamp bulb, a flood light, a cylindrical flashlight or a shaped display. The interconnect pattern 47 is connected to a power source, such as a power line or a battery, and the LED array may be used to emit visible, infrared or ultraviolet radiation.

IV. Alternative Embodiments

The preferred embodiments illustrated in FIGS. 2–13 illustrate an LED array which includes LED chips 59. However, other semiconductor or solid state devices may be packaged in the module instead of LED chips 59. For example, laser diode or other optoelectronic device chips, such as phototransistors and photodetectors may be used instead of LED chips. Furthermore, non-light emitting chips and electronic components may also be mounted in the carriers 21, 31. For example, logic and memory devices, such as microprocessors, ASICs, DRAMs and SRAMs, as well as electronic components, such as capacitors, inductors and resistors may be mounted in the carriers 31 instead of or in addition to the LED chips 59.

Furthermore, while a preferred order of fabrication steps was illustrated in FIGS. 2–13, the order of the module fabrication steps may be changed. For example, the step of adhering the base 41 to the carrier 31 shown in FIGS. 4 and 5 may follow the step of forming the reflective coating 57 shown in FIG. 6 or may follow the step of placing the LED chips 59 onto the carrier 31 shown in FIGS. 7 and 8 or may follow the steps of forming the encapsulating material 65 and/or the lens structure 67 shown in FIGS. 9–12.

V. The Carrier Fabrication Method

Figure 14:
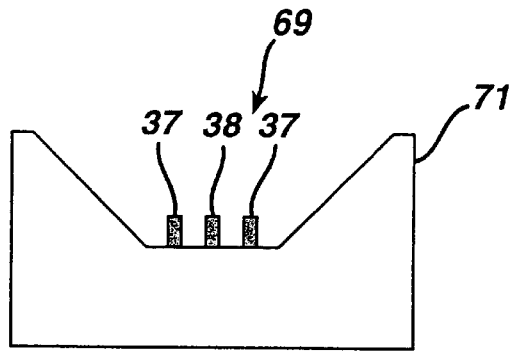
FIGS. 14 to 16 are side cross sectional views of the steps in a method of forming the carrier according to the first preferred embodiment of the present invention.
Figure 15:
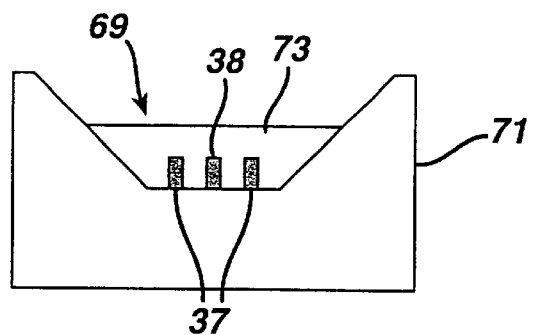
Figure 16:
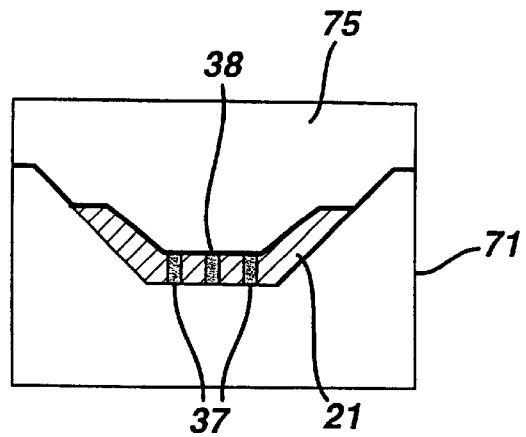

FIGS. 14–16 illustrate a preferred method of molding the rigid carriers 21, 31 of the first and second preferred embodiments. It should be noted that the carriers 21, 31 may be fabricated by any suitable method and are preferably prefabricated prior to the LED chip packaging methods illustrated in FIGS. 4–13. Furthermore, while FIGS. 14–16 illustrate the single cavity 25 carrier 21 of the first preferred embodiment, it should be understood that the plural cavity 35 carrier 31 of the second preferred embodiment may be made by the same techniques, except that the shape of the mold cavity is adjusted to form a carrier 31 with plural cavities 35.

The first step in a method of forming the carrier for a packaged solid state device comprises placing at least one conductive element into a cavity 69 in a lower portion of a mold 71, as illustrated in FIG. 14. The conductive elements may be the metal electrodes 37 or the heat sinks 38 described above. Preferably, the conductive elements have a post or cylinder shape. However, any other desired shape may be used.

The mold cavity 69 is then filled with a fluid insulating material 73, as illustrated in FIG. 15. The fluid insulating material may be any thermoset (solidifying upon application of heat and pressure) or thermoplastic (solidifying on cooling) plastic or polymer molding material. Preferably, the fluid insulating material comprises a thermoset epoxy molding material, such as a thermoset epoxy filled with a mineral, such as silica or beryllia. For example, Dexter Hysol FP4651 material supplied by Dexter Corporation Electronic Materials may be used. The mold cavity 69 is filled with the epoxy 73 by pouring the epoxy into the mold. An upper portion of the mold 75 is then placed over the lower portion of the mold 71, to shape the material 73 into a desired shape, as illustrated in FIG. 16.

Alternatively, other plastic materials may be used as the fluid insulating material 73. For example, a thermoset powder insulating material 73, such as Plaskon® SMT-B-1 material supplied by Amoco Electronic Materials, Inc, Bakelite®, or other phenolic molding material, may be packed around the conductive elements 37, 38. After placing the upper portion of the mold 75 over the lower portion of the mold 71, the powder 73 is heated under pressure to become a conformal fluid around the conductive elements 37, 38.

Furthermore, the insulating fluid material 73 may be a melted plastic that is injection molded through a runner and gate into the mold cavity 69 located between the lower 71 and the upper 75 mold portions. The injection molded plastic may be a thermoplastic or a thermoset material, such as polyimide, polyetherimide (PEI), polyethersulfone (PES) or polyethylene (PE).

After the fluid insulating material 73 is placed into the mold cavity 69 it is solidified to form an insulating carrier 21, (31) containing a cavity 25, as illustrated in FIG. 16. A thermoset molding material, such as molding epoxy or Bakelite® is solidified by applying heat and pressure to the material. A thermoplastic material is solidified by cooling the material in the mold cavity 69. At least two surfaces of the at least one conductive element 37, 38 are preferably exposed in two surfaces of the carrier after the solidification. If desired, a portion of the carrier 21 may be etched or polished away to expose the desired amount of the conductive elements.

After removing the carrier 21, (31) from the mold cavity 69, at least one solid state device 59 is then placed on the carrier 21, (31). The device 59 is in contact with at least one surface of the at least one conductive element, such as the electrodes 37 and/or the heat sinks 38. Preferably, the at least one solid state device comprises at least one light emitting diode chip 59 located in the carrier cavity 25, (35), in electrical contact with exposed top surface of the at least two electrodes 37.

Furthermore, the first side of the rigid plastic carrier 21, (31) may be adhered to a first side of a flexible module base 41 followed by forming a conductive interconnect pattern 47, 49 over a second side of the flexible module base extending through the flexible module base toward the at least one rigid carrier. This step may be performed before or after the step of placing the LED chip on the carrier 21, (31). The interconnect pattern 47, 49 forms an electrical connection with the at least one LED chip 59, as illustrated in FIGS. 11–13.

The preferred embodiments have been set forth herein for the purpose of illustration. However, this description should not be deemed to be a limitation on the scope of the invention. Accordingly, various modifications, adaptations, and alternatives may occur to one skilled in the art without departing from the scope of the claimed inventive concept.

What is claimed is:

1. A method of forming a packaged solid state device, comprising:

placing at least one conductive element into a mold cavity;

filling the mold cavity with a fluid insulating material;

solidifying the fluid insulating material to form an insulating carrier, wherein at least two surfaces of the at least one conductive element are exposed after solidification; and placing at least one solid state device on the insulating carrier in contact with one surface of the at least one conductive element.

2. The method of claim 1, wherein the at least one conductive element comprises a metal heat sink.

3. The method of claim 1, wherein the at least one conductive element comprises at least two metal electrodes.

4. The method of claim 3, wherein the at least one solid state device comprises at least one light emitting diode chip in electrical contact with the at least two metal electrodes.

5. The method of claim 4, wherein:

the step of filling comprises filling the mold with a fluid plastic or epoxy material;

the step of solidifying comprises heating or cooling the fluid plastic material to form a rigid plastic insulating carrier containing at least one cavity; and the step of placing at least one solid state device comprises placing at least one light emitting diode chip into the at least one cavity in contact with the exposed top surfaces of the two electrodes.

6. The method claim 4, wherein the step of filling comprises filling the mold with a powder plastic material and fluidizing the powder plastic material;

the step of solidifying comprises heating the fluidized material under pressure to form a rigid plastic insulating carrier containing at least one cavity; and the step of placing at least one solid state device comprises placing at least one light emitting diode chip into the at least one cavity in contact with the exposed top surfaces of the two electrodes.

7. The method of claim 4, further comprising:

adhering a first side of the insulating carrier to a first side of a flexible module base; and forming a conductive interconnect pattern over a second side of the flexible module base extending through the flexible module base toward the insulating carrier to form an electrical connection with the at least one light emitting diode chip.

8. A method of forming a packaged solid state device, comprising:

placing a plurality of feed through electrodes into a mold cavity;

filling the mold cavity with a fluid insulating material;

solidifying the fluid insulating material to form an insulating rigid carrier, such that first surfaces of the feed through electrodes are exposed in a first surface of the rigid carrier and second surfaces of the feed through electrodes are exposed in a second surface of the rigid carrier after solidification;

adhering the first side of the rigid carrier over a first side of a flexible module base, wherein the flexible module base comprises an insulating material;

forming a conductive interconnect pattern having a first portion over a second side of the flexible module base and a plurality of second portions extending through the flexible module base and contacting the exposed first surfaces of the feed through electrodes; and forming at least one light emitting diode on the second side of the rigid carrier and in electrical contact with the exposed second surfaces of the feed through electrodes.

9. The method of claim 8, wherein the step of adhering comprises forming an adhesive layer between the first side of the rigid carrier and the first side of the flexible module base prior to the step of forming the conductive interconnect but after the step of forming the plurality of feed through electrodes.

10. The method of claim 9, wherein the step of forming the conductive interconnect pattern comprises:

forming vias in the flexible module base extending through the adhesive layer, such that the vias expose the plurality of the feed through electrodes;

depositing at least one metal layer over the second side of the flexible module base and in the vias; and patterning the metal layer to form the conductive interconnect.

11. The method of claim 8, wherein:

the step of filling comprises filling the mold with a fluid plastic or epoxy material;

the step of solidifying comprises heating or cooling the fluid plastic material to form a plastic insulating rigid carrier containing at least one cavity; and the step of forming at least one light emitting diode comprises placing at least one light emitting diode chip into the at least one cavity.

12. The method claim 8, wherein:

the step of filling comprises filling the mold with a powder plastic material and fluidizing the powder plastic material;

the step of solidifying comprises heating the fluidized material under pressure to form a plastic insulating rigid carrier containing at least one cavity; and the step of forming at least one light emitting diode comprises placing at least one light emitting diode chip into the at least one cavity.

13. The method of claim 8, wherein the step of forming at least one light emitting diode comprises placing a plurality of light emitting diode chips with chip pads toward the second side of the rigid carrier such that the chip pads contact the exposed second surfaces of the feed through electrodes.

14. The method of claim 8, the step of forming at least one light emitting diode comprises:

placing a plurality of light emitting diode chips with chip pads away from the second side of the rigid carrier; and wire bonding a plurality of lead wires between the chip pads and the exposed second surfaces of the feed through electrodes.

15. A method of forming a packaged solid state device, comprising:

placing a plurality of feed through electrodes into a mold cavity;

filling the mold cavity with a fluid insulating material;

solidifying the fluid insulating material to form an insulating rigid carrier, such that first surfaces of the feed through electrodes are exposed in a first surface of the rigid carrier and second surfaces of the feed through electrodes are exposed in a second surface of the rigid carrier after solidification;

forming a conductive interconnect pattern having a first portion over a second side of a flexible module base and a plurality of second portions extending through the flexible module base, wherein the flexible module base comprises an insulating material;

adhering the first side of the rigid carrier over a first side of a flexible module base using an anisotropic adhesive layer; and forming at least one light emitting diode on the second side of the rigid carrier and in electrical contact with the exposed second surfaces of the feed through electrodes;

wherein:

the anisotropic adhesive layer is located between the first side of the rigid carrier and the first side of the flexible module base and in electrical contact with the exposed first sides of the feed through electrodes; and the anisotropic adhesive layer is electrically conductive substantially along a first axis between the rigid carrier and the flexible module base, but is electrically insulating substantially along a direction perpendicular to the first axis.

16. The method of claim 15, wherein the step of forming the plurality of feed through electrodes and the step of forming the conductive interconnect pattern occur prior to the step of adhering.

17. The method of claim 15, wherein:

the step of filling comprises filling the mold with a fluid plastic or epoxy material;

the step of solidifying comprises heating or cooling the fluid plastic material to form a plastic insulating rigid carrier containing at least one cavity; and the step of forming at least one light emitting diode comprises placing at least one light emitting diode chip into the at least one cavity.

18. The method claim 15, wherein:

the step of filling comprises filling the mold with a powder plastic material and fluidizing the powder plastic material;

the step of solidifying comprises heating the fluidized material under pressure to form a plastic insulating rigid carrier containing at least one cavity; and the step of forming at least one light emitting diode comprises placing at least one light emitting diode chip into the at least one cavity.

19. The method of claim 15, wherein the step of forming at least one light emitting diode comprises placing a plurality of light emitting diode chips with chip pads toward the second side of the rigid carrier such that the chip pads contact the exposed second surfaces of the feed through electrodes.

20. The method of claim 15, wherein the step of forming at least one light emitting diode comprises:

placing a plurality of light emitting diode chips with chip pads away from the second side of the rigid carrier; and wire bonding a plurality of lead wires between the chip pads and the exposed second surfaces of the feed through electrodes.

* * * * *